(12) United States Patent
Rimkunas et al.

(10) Patent No.: US 6,714,109 B1
(45) Date of Patent: Mar. 30, 2004

(54) METHOD OF SHIMMING A MAGNETIC FIELD

(75) Inventors: Joseph F. Rimkunas, Melville, NY (US); William H. Wahl, Smithtown, NY (US)

(73) Assignee: Fonar Corporation, Melville, NY (US)

( * ) Notice: Subject to any disclaimer, the term of this patent is extended or adjusted under 35 U.S.C. 154(b) by 0 days.

(21) Appl. No.: 10/353,382

(22) Filed: Jan. 29, 2003

Related U.S. Application Data (63) Continuation of application No. 09/840,035, filed on Apr. 24, 2001.

(51) Int. Cl.[7] .................................................. H01F 7/00
(52) U.S. Cl. ........................................ 335/301; 324/320
(58) Field of Search ........................ 335/216, 296–306, 335/318; 324/319, 320

(56) References Cited

U.S. PATENT DOCUMENTS

| | | | | |
|---|---|---|---|---|
| 4,646,045 A | * | 2/1987 | Chari et al. | 335/211 |
| 5,055,812 A | * | 10/1991 | Abele et al. | 335/210 |
| 5,072,204 A | * | 12/1991 | Leupold | 335/306 |
| 5,089,798 A | * | 2/1992 | Miyata | 335/211 |
| 5,431,165 A | * | 7/1995 | Sellers | 335/306 |
| 5,864,275 A | * | 1/1999 | Ohashi et al. | 335/297 |
| 5,923,235 A | * | 7/1999 | VanOort | 335/301 |
| 5,999,076 A | * | 12/1999 | Becker, Jr. et al. | 335/301 |
| 6,255,928 B1 | * | 7/2001 | VanOort et al. | 335/299 |
| 6,275,129 B1 | * | 8/2001 | VanOort | 335/301 |

* cited by examiner

*Primary Examiner*—Ramon M. Barrera
(74) *Attorney, Agent, or Firm*—IP Strategies, P.C.

(57) ABSTRACT

A process for adjusting an homogeneity of a magnetic field produced by a magnet having a pole includes placing a spherically-shaped magnetic shim element within the magnetic field so as to become magnetized and have a localized effect on the magnetic field. The magnetic field is mapped to provide an original field map, and a sphere action is selected that will adjust the homogeneity of the magnetic field. An effect on the magnetic field caused by the selected sphere action is calculated and combined with the original field map, to provide an adjusted field map, which is compared with the original field map. Based on the comparison, it is determined if the adjusted field map indicates a satisfactory adjustment of the homogeneity of the magnetic field, in which case the selected sphere action is performed.

41 Claims, 6 Drawing Sheets

METHOD OF SHIMMING A MAGNETIC FIELD

CROSS-REFERENCE TO RELATED APPLICATION

This is a continuation of co-pending U.S. patent application Ser. No. 09/840,035, which was filed on Apr. 24, 2001.

FIELD OF THE INVENTION

In general, the present invention relates to an apparatus and method of shimming a magnet In particular, the present invention is a method of determining the placement of shim elements, and an apparatus used to place the shim elements in specific locations on the pole surface of a magnet in order to shape the magnetic field to achieve greater uniformity.

BACKGROUND OF THE INVENTION

Magnetic resonance imaging ("MRI") is one of the most versatile and fastest growing modalities in medical imaging. As part of the MRI process, the subject patient is placed in an external magnetic field. This field is created by a magnet assembly, which may be closed or open. Open magnet assemblies have two spaced-apart magnet poles separated by a gap, and a working magnetic field volume located within the gap.

The diagnostic quality of images produced by MRI is directly related to several system performance characteristics. One very important consideration is the uniformity, or homogeneity, of the main magnetic field. In order to produce high-resolution images, the magnetic field produced in the MRI scanner must be maintained to a very high degree of uniformity. In particular, the homogeneity of the applied, constant background magnetic field directly affects the decay rate of the signal. That is, a field having a greater homogeneity has a slower decay rate. A slower decay rate results in more signal availability, allowing a greater signal-to-noise ratio, and thus better images. However, an MRI magnet initially produces a field that is usually less uniform than that required to image successfully, preferably one part per million deviation from homogeneous. At some point after manufacture, the magnet assembly must be adjusted to produce a more uniform field.

A process known as shimming is used to improve the homogeneity of the magnetic field to the necessary levels by making small mechanical and/or electrical adjustments to the overall field. Mechanical adjustments are called passive shimming, while electrical adjustments are known as active shimming. Electrical adjustments are effective because electrical current passing through a wire will produce a magnetic field around that wire. When these wires are formed into coils, the strength, direction, and shape of the magnetic field produced can be controlled by adjusting the physical and electrical parameters of the coils. Placing these coils in strategic locations as secondary magnetic field sources has the effect of adding to or subtracting from the main magnetic field in localized regions as well as over the entire pole surface, affecting the overall homogeneity of the main field. While the use of these "shim coils" has allowed the homogeneity of the main MRI magnetic field to be greatly improved, there are numerous drawbacks associated with their use.

For example, the electric current in the shim coils may be unstable, resulting in an overall instability in the main magnetic field. This instability may cause "ghosting" in the MR images. Ghosting is an interference phenomenon that appears at periodic intervals along the phase axis. These errors are unacceptable to any radiologist, who may confuse the correct position of the patient's anatomic elements, possibly resulting in an incorrect diagnosis.

Further, shim coils are temperature sensitive. Variations in the temperature of the individual coils can cause instabilities in the main magnetic field, resulting in image artifacts. In addition, the currents used to produce the magnetic fields in the shim coils require complicated electronic circuits, such as voltage and current regulators and current amplifiers, to maintain stability. The shim coil can become inoperable when one or more of these electronic components breaks or goes out of tolerance. Even when all the electronic components are working properly, this type of active shimming adds expense and complexity to the overall MRI system. Passive shimming avoids adding complexity and expense to the MRI system, but instead requires complex calculations and a time-consuming, iterative process of modifying an arrangement of magnetic elements to shape the field.

It is common practice to represent the field in terms of a complete set of functions such as spherical harmonics, and to apply shims that attempt to reduce the amplitude of each of the functions. After one of the terms has been reduced to an acceptable level, the next term is considered. The problem with this method is that there may be many significant functions in an accurate representation of the field. To shim them one at a time is a long and tedious process.

Further, it is usually impossible to produce a shim that affects only a single one of the functions. Often the correction of one function will lead to the appearance of one of the other functions.

There is therefore a great need for a method of shimming a magnet to control the homogeneity of the resulting field that is accurate and efficient, in terms of both the time and the computational resources required to produce the desired homogeneity. The need also exists for shim elements to be used in implementing the method that provide a predictable effect on the background field, and which are simple to apply to the magnet pole.

SUMMARY OF THE INVENTION

It is therefore an objective of the present invention to provide a shimming process that determines the optimum placement location of shim elements for increasing or otherwise adjusting the uniformity of a magnetic field.

It is a further objective of the present invention to provide a shimming process that determines the optimum size of shim elements to be disposed for increasing or otherwise adjusting the uniformity of a magnetic field.

It is also an objective of the present invention to provide shimming elements that can be used in a shimming method, placement of which have predictable effects on the magnetic field.

It is another objective of the present invention to provide a holding apparatus that allows for simple placement of the shimming elements when implementing the shimming method.

To overcome the foregoing disadvantages of the active (coil) shimming process, the present invention eliminates or minimizes the use of some or all shim coils and their associated currents altogether, achieving a high degree of field uniformity required for high resolution imaging through a process using only passive shimming. The shimming is effected through the use of magnetic shim elements that are added to the standard magnet in order to physically influence the overall field produced by the magnet. The shim elements may be held in place by a non-metallic, non-magnetic position plate that is affixed to the magnet pole. The shim elements take the form of magnetic spheres. To overcome the to disadvantages of conventional passive shimming techniques, the present invention also provides a process for determining the optimum sizes and locations of the shimming spheres in order to maximize field homogeneity.

According to a first aspect of the present invention, an apparatus for changing the homogeneity of a magnetic field produced by a magnet having a pole includes a shim element, and a non-magnetic plate for attachment to the magnet pole. The shim element is to be placed within the magnetic field so as to become magnetized and have an effect on the magnetic field. The plate is adapted to receive the shim element such that the shim element is disposed at a fixed position with respect to the non-magnetic plate. The shim element includes a magnetic material that is formed substantially in the shape of a sphere. The shim element may be a plurality of shim elements. The magnetic material may be a soft-ferromagnetic material. The sphere shape of each of the plurality of shim elements has a radius, and the radius of the sphere shape of one of the plurality of shim elements may be different than the radius of the sphere shape of another of the plurality of shim elements. The apparatus may also include a shim holder that is adapted to hold the shim element, wherein the plate is adapted to receive the shim holder at the fixed position. The shim holder may be a non-magnetic sphere having a bore for receiving the shim element. In this case, the plate includes a notched hole at the fixed position, such that a diameter of the hole is smaller than a diameter of the non-magnetic sphere, and a diameter of the notch is at least as large as the diameter of the non-magnetic sphere. Alternatively, the shim holder may be a non-magnetic screw having outer threads, and a bore for receiving the shim element. In this case, the plate includes a threaded hole at the fixed position for receiving the screw, such that the threaded hole mates with the outer threads of the screw. The plate may be adapted to receive the shim holder at a plurality of positions, wherein any of the plurality of positions can be selected to be the fixed position. The apparatus may also include at least one second non-magnetic plate for attachment to the magnet pole outside a peripheral area of the first non-magnetic plate. The second non-magnetic plate is adapted to receive a shim element such that the shim element is disposed in a fixed position with respect to the second non-magnetic plate.

According to another aspect of the present invention, an apparatus for changing an homogeneity of a magnetic field produced by a magnet having a pole includes a plurality of shim elements, and a non-magnetic plate for attachment to the magnet pole. The shim elements are to be placed within the magnetic field so as to become magnetized and have an effect on the magnetic field. The plate is adapted to receive the plurality of shim elements such that the shim elements are disposed at respective fixed positions with respect to the non-magnetic plate. Each of the plurality of shim elements includes a magnetic material that is formed substantially in the shape of a sphere. The magnetic material may be a soft-ferromagnetic material. The sphere shape of each of the plurality of shim elements has a radius, and the radius of the sphere shape of at least one of the plurality of shim elements may be different than the radius of the sphere shape of at least another of the plurality of shim elements. The sphere shape of each of the plurality of shim elements may have a radius that is selected from among a number of fixed radii in a series of shim element sphere radii. The apparatus may also include a plurality of shim holders that are each adapted to hold a respective one of the plurality of shim elements, in which case the plate is adapted to receive the plurality of shim holders at the respective fixed positions. Each of the plurality of shim holders may be a non-magnetic sphere having a bore for receiving the respective one of the plurality of shim elements. In this case, the plate includes a notched hole at each of the respective fixed positions, such that a diameter of the hole is smaller than a diameter of the non-magnetic sphere, and a diameter of the notch is at least as large as the diameter of the non-magnetic sphere. Alternatively, each of the plurality of shim holders may be a non-magnetic screw having outer threads, and a bore for receiving the respective one of the plurality of shim elements. In this case, the plate includes a threaded hole at each of the respective fixed positions for receiving the screw, such that the threaded hole mates with the outer threads of the screw. The plate may be adapted to receive the plurality of shim holders at a plurality of positions, wherein the number of the plurality of positions is greater than the number of the plurality of shim holders. In this case, any of the plurality of positions can be selected to be one of the respective fixed positions. The apparatus may include at least one second non-magnetic plate for attachment to the magnet pole outside a peripheral area of the first non-magnetic plate. The second non-magnetic plate may be adapted to receive a shim element such that the shim element is disposed in a fixed position with respect to the second non-magnetic plate.

According to another aspect of the invention, a process for adjusting an homogeneity of a magnetic field produced by a magnet having a pole begins by mapping the magnetic field to provide original field map values. Alternatively, at least one spherically-shaped magnetic shim element may be placed within the magnetic field so as to become magnetized and have an effect on the magnetic field prior to providing the original field map values. A sphere action is selected that will adjust the homogeneity of the magnetic field. The selected sphere action may be the adding, removing, or replacing of a spherically-shaped magnetic shim element within the magnetic field so as to become magnetized and have an effect on the magnetic field. An effect on the magnetic field caused by the selected sphere action is calculated, and the calculated effect on the magnetic field of the selected sphere action is combined with the original field map, to provide adjusted field map values. The adjusted field map values are compared with the original field map values. Based on the comparison, it is determined whether the adjusted field map values indicate a satisfactory adjustment of the homogeneity of the magnetic field. If it is determined that the adjusted field map values indicate a satisfactory adjustment of the homogeneity of the magnetic field, the selected sphere action is performed to adjust the homogeneity of the magnetic field. According to a further aspect of this process, it is determined whether the magnetic field, including the effect on the magnetic field of the selected sphere action, has an acceptable level of homogeneity, based on the adjusted field map values. If it is determined that the level of homogeneity of the magnetic field, including the effect on the magnetic field of the selected sphere action, is not an acceptable level, a second sphere action that will adjust the homogeneity of the magnetic field is selected. Also according to a further aspect of this process, it is determined, based on the adjusted field map values, if the magnetic field, including the effect on the magnetic field of the selected sphere action, has an acceptable level of homogeneity. If it is determined that the level of homogeneity of the magnetic field, including the effect on the magnetic field of the selected sphere action, is not an acceptable level, a plurality of series sphere actions are selected that will adjust the homogeneity of the magnetic field. The series is continued until it is determined that the level of homogeneity of the magnetic field, including the effect on the magnetic field of the selected sphere actions, is an acceptable level. The selected plurality of sphere actions are then performed to adjust the homogeneity of the magnetic field. According to this further aspect of this process, an effect on the magnetic field caused by each of the selected sphere actions is calculated The calculated effect on the magnetic field of each of the selected sphere actions, is combined with the original field map to provide respective adjusted field map values. Each adjusted field map value in the series is compared with the previous field map value in the series. Based on the comparison, it is determined if the adjusted field map values indicate a satisfactory adjustment of the homogeneity of the magnetic field. If it is determined that the adjusted field map values indicate a satisfactory adjustment of the homogeneity of the magnetic field, the selected sphere action is performed to adjust the homogeneity of the magnetic field. The satisfactory adjustment of the homogeneity of the magnetic field for this process may be an adjustment that increases the homogeneity of the magnetic field.

According to another aspect of the present invention, a process for adjusting an homogeneity of a magnetic field produced by a magnet having a pole includes placing a spherically-shaped magnetic shim element within the magnetic field so as to become magnetized and have a localized effect on the magnetic field.

BRIEF DESCRIPTION OF THE DRAWINGS

These and other objectives and advantages of the present invention are apparent in light of the following detailed description and appended claims, with reference to the drawings, in which

DETAILED DESCRIPTION OF THE INVENTION

The present invention is a technique for shimming a magnetic field that includes placing magnetic material on or near a magnetic field generating apparatus. The magnetic material is held in place by holders designed for the material, and the optimum size and location of the magnetic material may be determined with the assistance of computer programs that implement aspects of the process of the invention.

1. Shim Elements

The magnetic material is formed in the shape of a sphere. Spheres are used because a sphere is the only shape of magnetic material that produces a pure dipole field when placed in a relatively uniform magnetic field (the degree of uniformity required of the background field is far less than the degree of uniformity usually found in the unshimmed magnetic field). The spherical shape also eliminates any alignment difficulties, since the shape is the same in every direction.

The spheres can be made of any magnetic material, such as hard-ferromagnetic, soft-ferromagnetic, paramagnetic, or diamagnetic material. Soft-ferromagnetic materials, such as carbon steel, are preferred because they afford the strongest effect with the fewest problems. The other types of magnetic material may be used, however, although additional factors may have to be considered. The use of hard-ferromagnetic material requires precision alignment of the magnetization. Paramagnetic and diamagnetic materials produce such a small effect that they are best suited for use in the finest of shimming exercises. Another factor in choosing the magnetic material is availability. Carbon steel spheres are readily obtainable. For example, spheres of the preferred magnetic material, a low carbon steel, AISI C1010-C1018, are available from C&S Engineering Inc., Meriden, Conn.

It is preferred that an assortment of diameters of spheres is used to give different amplitudes of effect. For example, a series of spheres having diameters of between $\frac{1}{16}$" and $\frac{3}{8}$", separated by increments of $\frac{1}{32}$", gives a good range of effects.

Spheres are available in different sphericity grades. Since the diameter of the sphere is important in making calculations to describe the resulting field, the sphericity is preferably at least about grade 1000, which indicates a tolerance of 0.001" on the diameter.

A sphere of soft-magnetic material, when placed in a uniform magnetic field, acquires a magnetization given by $$M = \frac{3}{4\pi}(B_0 - H_{int}),$$

where $B_0$ is the strength of the uniform field and $H_{int}$ is the magnetic field intensity within the sphere. A magnetized sphere has the magnetic field of a dipole with a Y component of the field strength given by $$B_Y = \frac{m}{R^3}\left(3\frac{Y^2}{R^2} - 1\right), \tag{Eq. 1}$$

where m is the dipole moment of the sphere, R is the distance from the center of the sphere to the observation point (that is, $R=[X^2+Y^2+Z^2]^{1/2}$), and Y is the Y component of R. This dipole field adds vectorily to the background field when the sphere is in the background field. This allows the spheres to shim, or correct, the background field when placed in the proper positions. The dipole moment, m, of a sphere is the volume of the sphere times the sphere's magnetization. Thus, $$m=VM=r^3(B_0-H_{int}),$$

where r is the radius of the sphere. To enable the accurate calculation of a field map due to the placement of a shim sphere, the dipole moment must be known. The magnetization, and hence the dipole moment, can be found experimentally or theoretically. Experimentally, a sphere or several spheres are placed in the background field and the effect is recorded. The theoretical effect is calculated, leaving the magnetization as a variable. A least-squares fit can then be used to determine the best value for the magnetization. Theoretical determination of the magnetization can be made by calculating the value of $(B_0-H_{int})$ by using the relationship between the external and internal fields of a magnetized sphere, which can be represented by $$B_{int}=3B_0-2H_{int},$$

and the relationship between $B_{int}$ and $H_{int}$ (that is, the hysteresis curve for the material). Knowledge of $B_0$ and $H_{int}$ allows determination of m and subsequently, determination of $B_Y$. The simple calculation used to determine $B_Y$ is a key advantage of a shimming process using shimming spheres, compared to other steel shimming methods that use wires or magnetic materials having other shapes and that require finite element software to calculate the effects.

2. Shim Holders

The devices for holding the spheres in position must be non-magnetic and must fit within the background magnetic field. The holding devices make it possible for the shimming spheres to be placed adjacent the pole pieces of the magnet structure, adjacent any other insertions, including any insertions related to shimming by other methods, or adjacent any other features, such as shim bars. Preferably, the positions at which the holding devices are placed should be at least about one inch apart, in order to prevent any appreciable perturbation of the magnetic state of neighboring spheres. The available positions must be located in a region of the background magnetic field where the background magnetic field is uniform to within about 5%. This region may be found by measurement or by calculation. Each available position should be adapted to receive a holding device, or the shimming spheres may be glued in place directly on the magnet. A holding device can actually be disposed at each location if each such device can be adapted to hold a sphere having any one of a number of different diameters.

Figure 1:
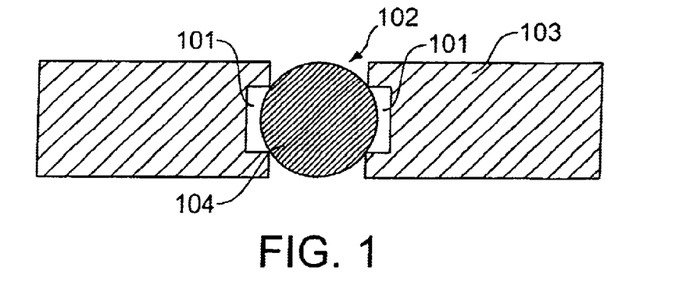
FIG. 1 shows a shimming sphere of the present invention, held by a first exemplary holding device of the present invention.
Figure 2:
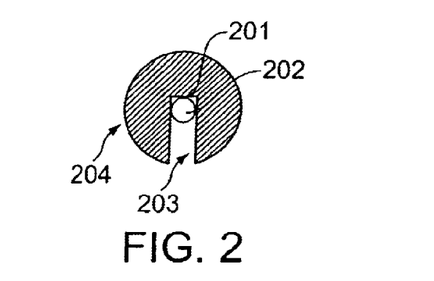
FIG. 2 shows a shimming sphere of the present invention, within an adapter for the holding device of FIG. 1 of the present invention.

Ideally, sphere insertion can be accomplished without turning the background magnetic field off. One way to accomplish this is to locate plastic pieces at all of the available sphere positions, with each piece having a shimming sphere receptacle, such as a hole, formed in it. The plastic pieces may be fabricated and located individually, or each may be one of many formed on a plate. Each hole is slightly smaller than the diameter of the largest shimming sphere contemplated for use as the magnetic material. As shown in FIG. 1, a notch 101 is cut around the midpoint of the hole 102 in an exemplary holding is device 103, so that the sphere 104 having the largest diameter in the series can snap into place in the hole 102. When it is desirable to use smaller spheres of magnetic material, adapters 201 in the form of plastic spheres can be used with the plastic pieces, as shown in FIG. 2. That is, the smaller spheres 202 of magnetic material can be inserted into a cavity 203 in a plastic sphere 201 having substantially the same diameter as the largest magnetic sphere, and then that assembly 204 can snap into the notched hole 102 of the holding device 103. If the holding device 103 is part of a plate having a number of holding devices, the assemblies 204 can be added to the plate prior to or after the plate is located at the sphere positions. A drop of glue can be added to the cavity 203 to ensure that the sphere location remains constant, or the sphere 202 can be press-fit into the cavity 203.

Figure 3:
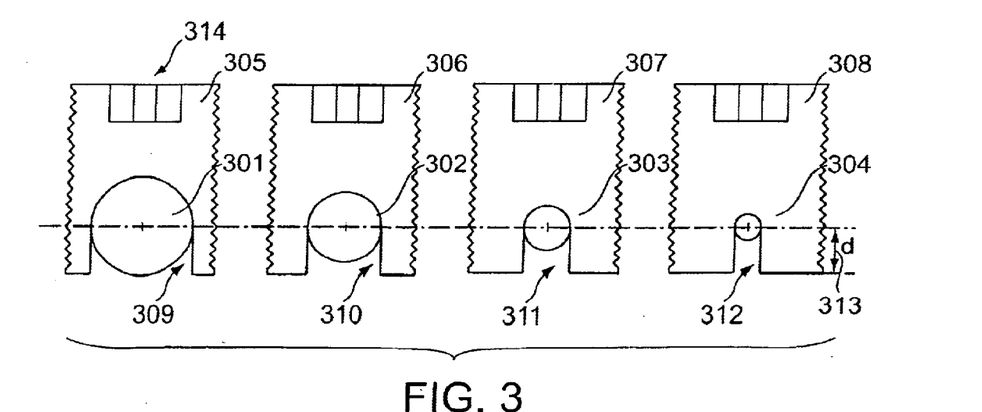
FIG. 3 shows a series of second holding devices of the present invention.

Another way to locate the spheres of magnetic material at the determined positions is to provide a hole at each shimming position, to mate with matching nylon screws that each have a cavity to accept a sphere. As shown in FIG. 3, each size shimming sphere 301–304 corresponds to a respective nylon screw 305–308 having a cavity 309–312 that is appropriately sized to accept the corresponding shimming sphere 301–304. The depths of the cavities 309–312 in the respective screws 305–308 vary such that the centers of all shimming spheres 301–304 are aligned in the same plane 313 when the screws 305–308 are fully mated in the holes located at each position. Again, a drop of glue can be added to the cavity 309–312 to ensure that the shimming sphere 301–304 stays in place, or the shimming sphere 301–304 can be press fit into the cavity 309–312. The sphere/screw assembly is then simply screwed into the threaded hole located at the appropriate position.

In more detail, exemplary sphere holders are fabricated from ½–13×½" long nylon set screws. The setscrews have a physical accommodation, such as a ¼" hex hole 314 on one end for accepting an Allen wrench, to enable the screws to be secured in tapped hole locations. The lead end of the screw 305–308 is drilled out to form the cavity 309–312, using, for example, a ball nose bit that has the same or slightly smaller diameter relative to the diameter of the shimming sphere that will be inserted. The depth of the cavity 309–312 differs for each size sphere, so that the center of any size sphere placed in the appropriate screw is located at the same distance d from the lead end of the set screw.

Figure 4:
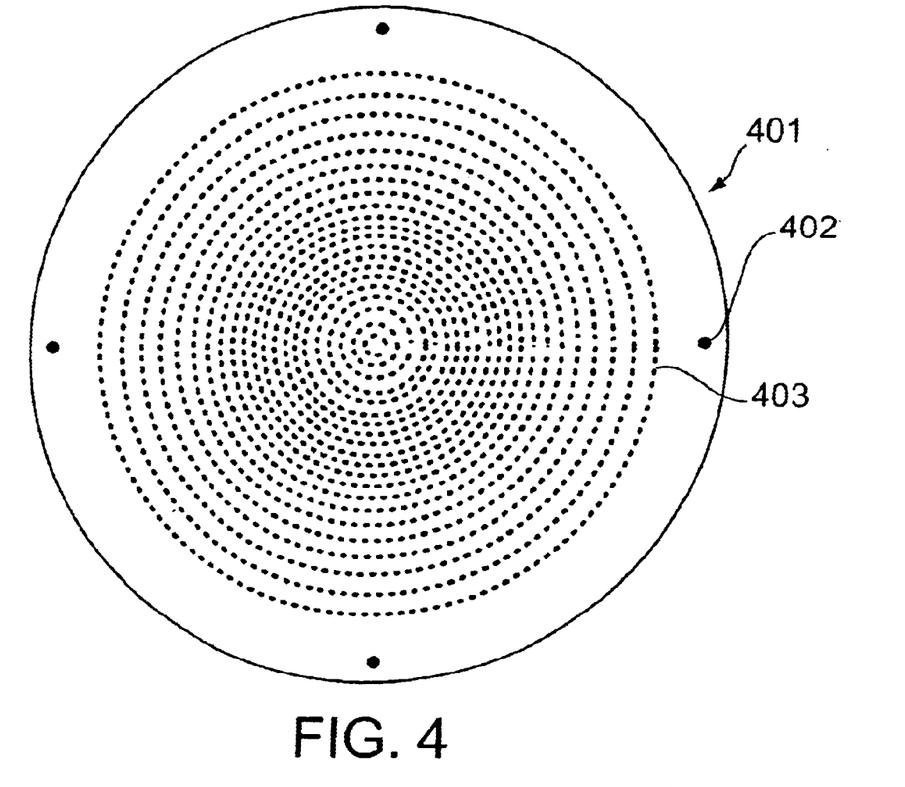
FIG. 4 shows an exemplary position plate of the present invention.

Referring to FIG. 4, in order to provide for the shimming spheres to be placed at positions on or above the plane of the magnet pole, a position plate 401 is attached to the pole, and the screws holding the shimming spheres are screwed into the position plate. The position plate 401 is constructed of non-magnetic material, for example, ½" thick PVC. It is cut into a shape that will match the geometry of the magnetic field-producing structure. In the case of an open MRI magnet, the shape is preferably a circle having a radius of, for example, 22 inches. The position plate 401 also has holes 402 for mounting and aligning purposes. One plate 401 is installed on each magnet pole.

Each position plate 401 has holes 403 drilled and tapped to accept the exemplary ½–13×½" screws. The holes are made in specific positions in order to create an even, standard distribution of potential shimming sphere locations, and to keep the distance between adjacent locations to some minimum distance, preferably at least about one inch. In order to keep the shimming spheres within the substantially uniform region of the background magnetic field, the maximum radius contemplated for shimming sphere locations, and therefore hole positions, based on finite element models of the magnet, is about 16 inches. Table 1 below lists exemplary hole positions for placement of shimming spheres, showing the angular separation between adjacent sphere positions at each radius, as well as the starting offset angle from some predetermined radius designated as 0°.

TABLE 1

| RADIUS (inches) | ANGULAR SEPARATION (degrees) | STARTING OFFSET ANGLE (degrees) |
| --- | --- | --- |
| 1 | 80 | 0 |
| 2 | 30 | 15 |
| 3 | 20 | 0 |
| 4 | 15 | 7.5 |
| 5 | 12 | 0 |
| 6 | 10 | 5 |
| 7 | 8 | 0 |
| 8 | 8 | 4 |
| 9 | 6 | 0 |
| 10 | 6 | 3 |

TABLE 1-continued

| RADIUS (inches) | ANGULAR SEPARATION (degrees) | STARTING OFFSET ANGLE (degrees) |
|---|---|---|
| 11 | 5 | 0 |
| 12 | 5 | 2.5 |
| 13 | 4 | 0 |
| 14 | 4 | 2 |
| 15 | 4 | 0 |
| 16 | 4 | 2 |

FIG. 4 show a top view of a position plate constructed according to the specification of Table 1.

Figure 5:
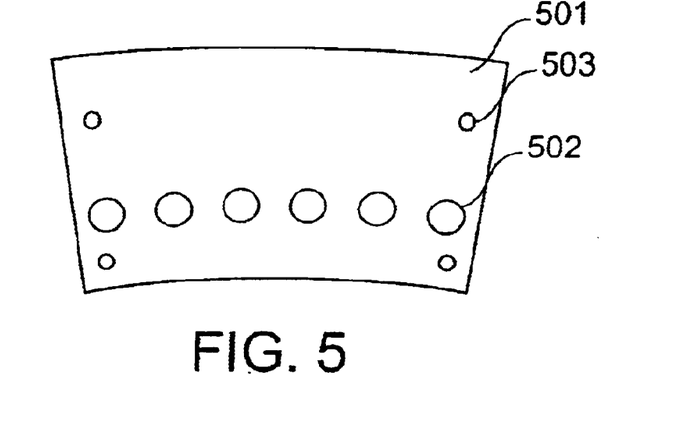
FIG. 5 shows a shim bar position plate of the present invention.

Preferably, any shim bar position plates are likewise drilled and tapped with ½–13 threads. As shown in FIG. 5, the plates 501 preferably lie on 15-degree arcs of a circle and are all located on the shim bars (typically, raised areas) of the magnet poles at a radius beyond the outer radius of the position plate 401, preferably at a radius of 23.3 inches. This preferred radius was chosen by selecting a radius that was within a uniform field region determined using a finite element analysis of the field just above the shim bar surface. The angular separation between the tapped holes 502 in the shim bar position plates 501 is 2.5 degrees. The shim bar position plates 501 are mounted on the top and bottom shimbars using mounting holes 503. The tapped holes 502 provide additional potential shimming sphere locations on the shim bar itself.

3. Sizing and Positioning Procedure

As previously described, the present invention makes use of a desirable shape of magnetic material in shimming the field, and of inventive devices for holding the shimming elements in place. However, a procedure is required to provide shimming spheres of optimum sizes at the most suitable locations in order to maximize uniformity of the field. The present invention includes such a procedure for determining these parameters.

Figure 6:
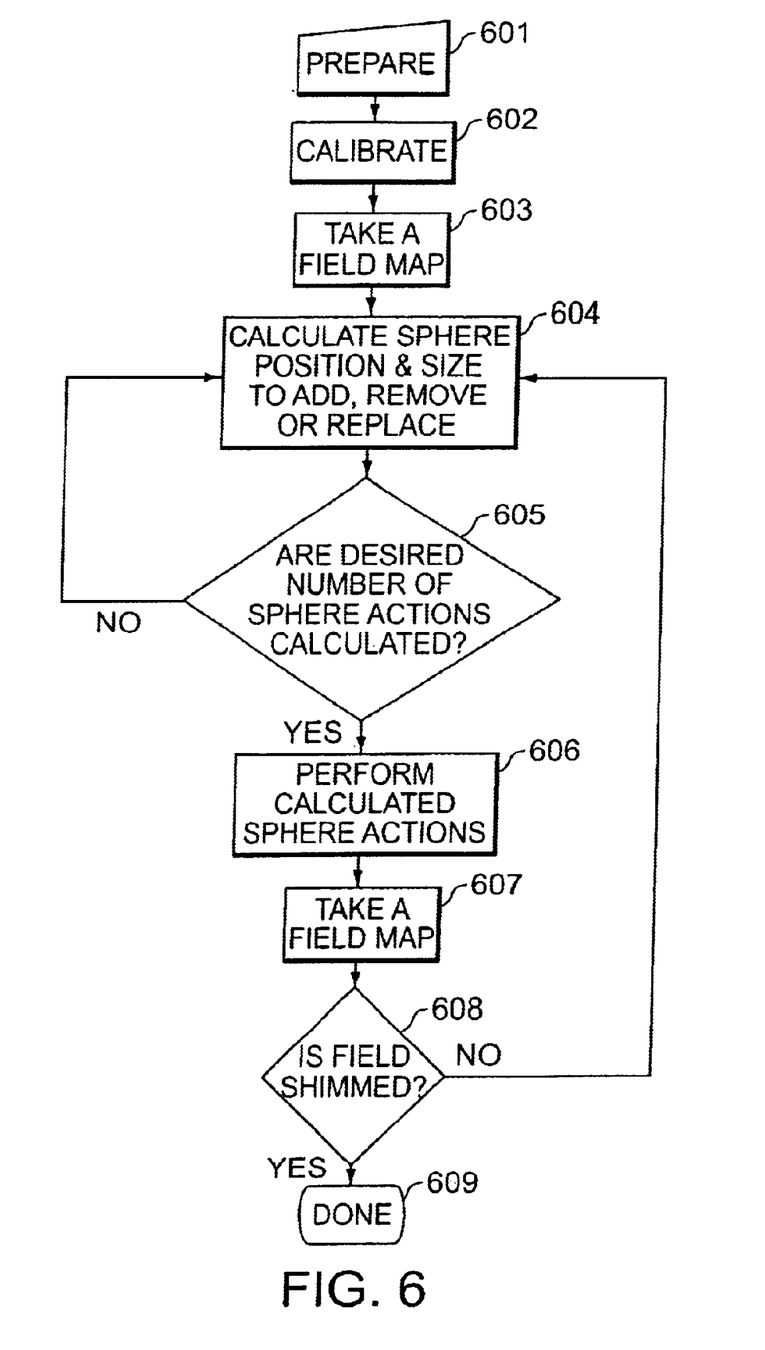
FIG. 6 is a flow diagram illustrating the overall shimming process of the present invention.

FIG. 6 is a flow diagram illustrating the overall shimming process of the present invention. The procedure of the invention is used to determine the size and location of shimming spheres that result in the greatest possible reduction of the standard deviation and/or range of the field map. If it is determined that the standard deviation and range cannot both be reduced by adding, removing, or replacing shimming spheres, then sphere sizes and positions are determined that reduce the standard deviation while causing the least possible increase in the range. If it is determined that further shimming will not reduce the range, then shimming is complete, unless new sphere sizes or positions are introduced to more finely adjust the field, or unless the field is perturbed.

According to another aspect of the present invention, the procedure can be used to determine sizing and placement of more than one shimming sphere at a time. This is a significant advantage provided by the invention, because it is possible that any one shimming sphere placed by itself may make the field less uniform, but when combined with other advantageously placed spheres, the field is made more uniform. Another option provided by the inventive procedure is removal of spheres that were added prior to shimming as trial or initialization shims, or of shimming spheres that were placed earlier in the shimming process. Making substitutions for previously placed shimming spheres is also an option. That is, a shimming sphere placed in a particular position can be replaced by a shimming sphere having a different diameter, if it is determined that the replacement will improve the standard deviation and the range.

As shown in FIG. 6, the first action in the overall shimming process is preparation 601. Preparations made for the shimming process include installing spheres in the sphere holders, mounting shim plates onto the magnet structure, and installing the field mapping equipment.

Next, a calibration procedure is performed 602 to determine the magnetization of the shimming spheres in the magnet at each radius away from the center axis of the magnetic field. Ideally, a magnetic strength for every sphere size at every possible sphere position can be determined. However, it is more practical, and sufficient, to determine the magnetic strength of the largest sphere size at various radii away from the center axis of the magnetic field. A sphere of any radius at any position at a certain radius in the magnet is then estimated to have approximately the same magnetic strength. The calibration process begins by taking a first field map, and then adding a ring of spheres to the magnet. A second field map is then taken, and the first field map is subtracted from the second field map to determine an actual map of the effect of the ring of spheres. A theoretical map of this effect of the ring of spheres is also calculated, leaving the magnetic strength as a variable. Then, the magnetic strength that makes the theoretical map of the effect of the ring of spheres most closely match the actual map of the ring of spheres is calculated, by, for example, the method of least squares regression. This calculated value of the magnetic strength is the value of the magnetic strength that will be used for all future map calculations for spheres positioned at that radius in the magnet. This procedure is repeated for other radii in the magnet to obtain a complete set of magnetic strength values.

Once calibration is complete, a field map is measured 603. Because knowledge of the field values facilitates the determination of homogenizing corrections, this is the starting point of the shimming procedure.

Figure 7A:
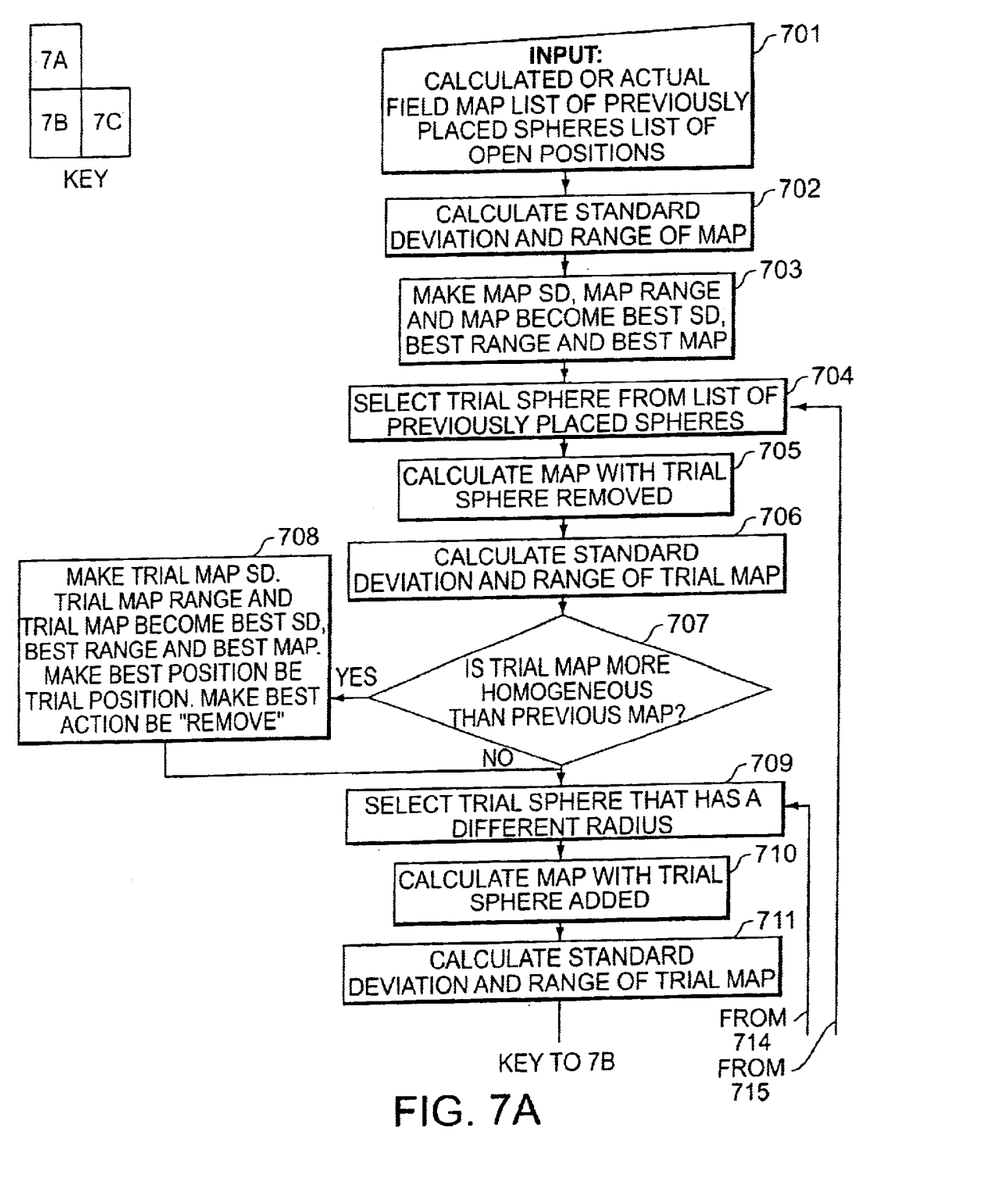
FIGS. 7A, 7B, 7C are flow diagrams illustrating the shimming sphere action determination procedure of the present invention.

The best sphere action is then selected 604. This calculation determines the best sphere action to take, depending upon the desired homogenizing effect or combination of effects. These effects may include, for example, lowest standard deviation, lowest range, and lowest field map point value. The details of the best sphere action calculation are described below with reference to FIG. 7. The best sphere action calculation will provide information such as sphere size, sphere position in the magnet, and the type of action (add, remove, or replace) resulting in the desired homogenizing effect.

A test is then performed 605 to determine if the desired number of sphere actions has been taken. There is some number of sphere actions (typically 20–50) that can be taken based on calculated maps before the calculated map diverges from the actual map. This divergence occurs because there is some tolerance in the calculated maps that builds up with each action. This test is performed to allow the desired number of sphere actions to be selected by repeating the previous step until that number is reached. Thus, if the maximum number of acceptable actions has not yet been reached, sphere actions can continue to be selected.

When the maximum number of acceptable actions is reached, the selected sphere actions are performed 606. That is, the spheres specified according to size and location by the sphere action calculation are actually added, removed, or replaced, as directed by the sphere action determination. These sphere actions can be carried out at one time once the maximum number of acceptable actions is reached, or can be carried out individually as each action is determined for efficiency.

A new field-map is then taken 607. This map shows the effect of the sphere arrangement and updates the current field map in order to clear all tolerance build up.

It is then determined from the new field map whether the field is adequately shimmed 608. The field map is tested for a predetermined level of homogeneity, and if the field is not shimmed to satisfaction, that is, to the predetermined level, the next iteration of sphere action calculations is begun, based on the new field map. If the field is shimmed to within an acceptable level, the shimming process is terminated 609.

Figure 7B:
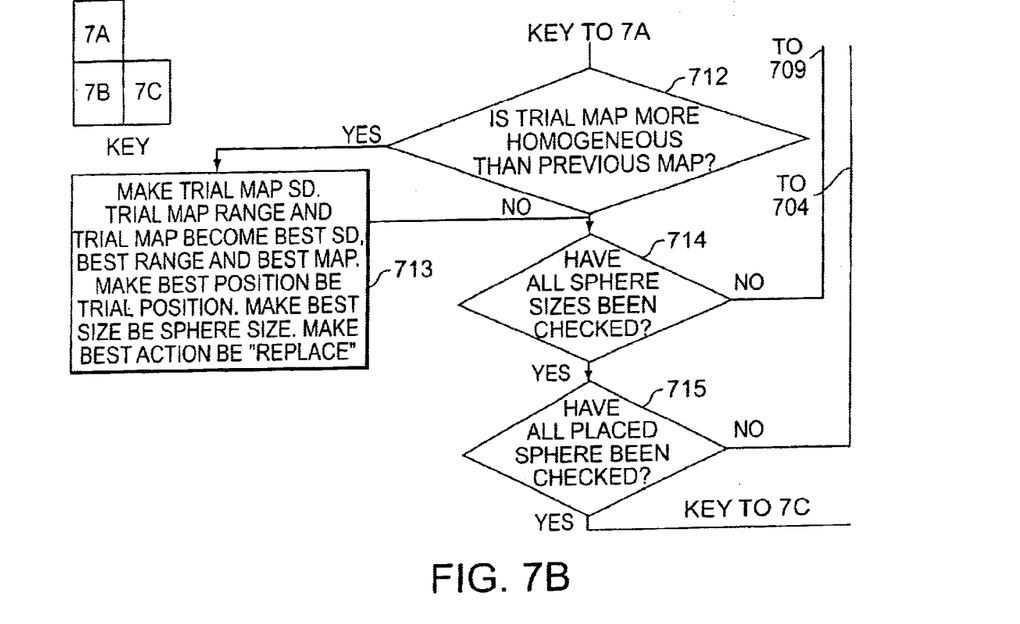
Figure 7C:
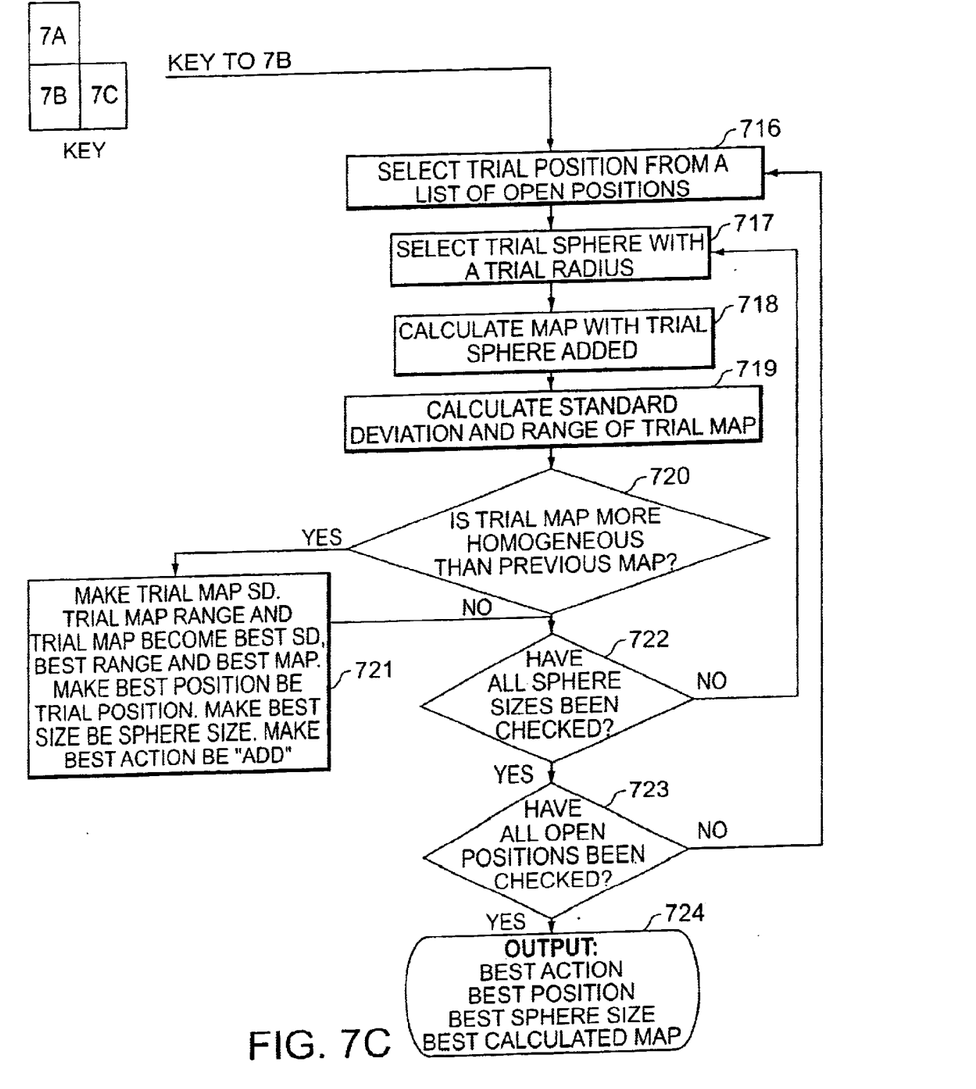

Referring to FIG. 7, the sphere action calculation procedure is described in detail. Generally, the effects on the homogeneity of the field due to addition, removal, or change in sphere size (replacement) of shimming spheres at each location are determined. Actions determined to lead to greater field homogeneity are determined and the resulting calculated field map is used as the standard against which subsequent calculated field maps are measured. It is contemplated that, within the spirit and scope of the present invention, the process of determining the best sphere action may be determined in any one of a number of ways. The following text describes an efficient process for making this determination, and is presented by way of example only. The process of the present invention includes deviations from this exemplary process, and is not limited strictly to the sequence of acts set forth below.

First, input data must be received and processed 701 in order for the sphere action calculation to be implemented or continued. A starting field map, either calculated or actual, must be provided, so that a new field map can be calculated based on a sphere action. For example, the initial field map measured 603 after calibration may be used for the first iteration of sphere action determinations. For subsequent iterations, the field map taken 607 after the previous iteration may be used. A list of previously-placed spheres must also be provided so that an action will not be attempted that would result in two spheres in one location, and so that removal decisions can be made properly. Likewise, a list of available or open positions, that is, positions that are unoccupied, must be provided, so that addition decisions can be made properly.

The standard deviation and range are then calculated 702, based on the starting field map. The standard deviation is a measure of variability of the field, and is basically the average difference in field strength from the mean. The range is the difference between the highest and lowest map values.

The starting map and its standard deviation and range are initially assigned 703 to be the best map and standard deviation and range up to this point. This will allow a determination to be made about whether a subsequent sphere action would make the field more homogeneous.

In the exemplary process described herein, removal actions are evaluated first. It should be noted that, during at least the first iteration of sphere action determinations, there will be no spheres that were placed due to previous iterations of sphere action determination. Thus, in order to evaluate removal actions, at least one initial shimming sphere must be placed prior to taking the starting map. Alternatively, the first iteration may skip the removal and replacement evaluations, and begin with an addition evaluation 716. Regardless of how spheres were placed, a previously-placed sphere is selected 704 from among the spheres on the list of placed spheres. This selected sphere is designated as the current trial sphere.

The field due to the trial sphere is then calculated based on its size, magnetic moment, and position, and this field value is subtracted 705 from the current map to create a trial map; This trial map is really the calculated map, with the effect of the trial sphere removed from the current map.

The standard deviation and range of the trial map are now calculated 706. These values can be used to indicate the homogeneity of the calculated trial map.

Next, the trial homogeneity is compared 707 with the current best stored homogeneity. The homogeneity indicator, that is, the measure by which the level of homogeneity of the field is judged, can be the standard deviation of the field, the range, the maximum value of a point, or any parameter considered to be important for that particular application, including any combination of these indicators. If the comparison indicates that the trial map is more homogeneous than the current best map, then the current best map is replaced with the trial map 708, removal of the trial sphere is indicated as the best sphere action, and the necessary information (sphere sizes and locations, indicator value) is recorded. If the test determines that the trial map is not more homogeneous than the current best map, then the process continues.

Next, a trial sphere is chosen 709 that is a different size than the sphere that is occupying the current trial position, in order to determine the effect of a replacement sphere at this location. The field due to the replacement trial sphere is then calculated 710, based on the size, magnetic moment, and position, and this field value is added to the current trial map of the field with the replaced sphere removed to create another trial map. Thus, this second trial map is really the calculated map with the removed trial sphere replaced with a sphere of another size.

The standard deviation and range, and/or other indicators, of the trial map are then calculated 711. These values are then used to determine the homogeneity of the calculated, second trial map.

Next, the trial homogeneity is compared 712 with the current best stored homogeneity. The homogeneity indicator, that is, the measure by which the level of homogeneity of the field is judged, can be the standard deviation of the field, the range, the maximum value of a point, or any parameter considered to be important for that particular application, including any combination of these indicators. If the comparison indicates that the trial map is more homogeneous than the current best map, then the current best map is replaced with the trial map 713, replacement of the trial sphere is indicated as the best sphere action, and the necessary information (sphere sizes and locations, indicator value) is recorded. If the test determines that the trial map is not more homogeneous than the current best map, then the process continues.

At this point, it is determined whether all sphere sizes have been checked at the trial position 714. That is, it is determined whether the sphere action of replacement has been performed at the trial position for every available sphere size. If not, the replacement sphere action determination is repeated for the next unchecked sphere size. If all sizes have been checked at that trial position, the process continues.

At this point, it is determined whether all placed spheres have been checked for the effects of removal 715. If every placed sphere from the list of placed spheres has not been considered yet, then the removal sphere action determination is repeated until all placed spheres have been considered. When all placed spheres have been considered, the process continues.

Next, open locations, that is, sphere locations that do not have a placed sphere, are considered. First, a trial location is selected 716 from among the list of open positions. Next, a trial sphere is selected 717. This current trial sphere has a radius that previously has not been considered at this location. The field due to this trial sphere is then calculated, based on its size and magnetic moment at the trial position. This field is added to the current map of the field to generate a trial map 718, which is the calculated map with the trial sphere effect added in.

The standard deviation and range, and/or other indicators, of the trial map are then calculated 719. These values are used to determine the homogeneity of the calculated trial map.

Next, the trial homogeneity is compared 720 with the current best stored homogeneity. The homogeneity indicator, that is, the measure by which the level of homogeneity of the field is judged, can be the standard deviation of the field, the range, the maximum value of a point, or any parameter considered to be important for that particular application, including any combination of these indicators. If the comparison indicates that the trial map is more homogeneous than the current best map, then the current best map is replaced with the trial map 721, addition of the trial sphere is indicated as the best sphere action, and the necessary information (sphere sizes and locations, indicator value) is recorded. If the test determines that the trial map is not more homogeneous than the current best map, then the process continues.

At this point, it is determined whether all sphere sizes have been checked at the trial position 722. That is, it is determined whether the sphere action of addition has been performed at the trial position for every available sphere size. If not, the addition sphere action determination is repeated with the next unchecked sphere radius as the trial radius. If all radii have been checked at that trial position, the process continues.

At this point, it is determined Whether all open locations have been checked for the effects of sphere addition 723. If every open location from the list of open locations has not been considered yet, then the addition sphere action determination is repeated until all open locations have been considered. When all open locations have been considered, the process is terminated 724.

It should be noted that the shimming process may be interrupted if it is determined that a threshold number of sphere actions has been taken 605, as described previously as part of the overall shimming process.

It should also be noted that the process of adjusting the homogeneity of the field for greater homogeneity has been presented by way of example only. The present invention is directed generally to a process for shimming the field in order to adjust the homogeneity of the field. Thus, a satisfactory adjustment of the homogeneity, determined 707, 712, 720 after a sphere action calculation, may actually be a decrease in the homogeneity of the field. In this case, a final shimming determination 808 will be made based on whether a low enough level of homogeneity has been reached. Similarly, the desired shimming result may be for the homogeneity to fall within a specified range, or to have a particular profile. The process of the present invention can be advantageously used to provide any of these results.

Further, the sphere action determinations may be made in any order according to the type of action evaluated. For example, sphere addition determinations may be made first, followed by replacement, followed by removal. The present invention is not limited to the specific sequence shown in FIG. 7.

The final output of stored information provides the details of the best action to take, as recorded following the homogeneity tests. The best action recorded will be one of adding, removing, or replacing a sphere at the best location. The output thus will indicate the size of the selected sphere at that location, if any, resulting in the calculated best action. Also provided as part of the output is the map of the field, calculated as a result of having the action carried out. This is utilized to calculate the next action.

According to the present invention, advantageous use may be made of computer programs to provide the calculations necessary to determine the most effective placement of the shimming spheres. These programs manipulate data that is measured, collected, and stored during other periods in the process, to provide information that can be used to continue adjusting the field.

For example, a first program, Program 1, can be used to calculate the best experimental values of the magnetization, which are needed to calculate the dipole moment, m, in Eq. 1 above, which in turn is used to compute the field of each shimming sphere. The program accepts a difference map as an input, where the difference map is a map of the difference between two maps, that is, the result of the comparison of map data stored during two mapping procedures. The two maps used are a map of the magnetic field with no added spheres, and a map of the magnetic field with some arrangement of shimming spheres. The program calculates a factor that fits a theoretical map of the effect of the arrangement of shimming spheres to the actual, experimentally obtained, difference map. This factor is then used in a second exemplary program, Program 2, to assign a value of the magnetization to each position.

Program 2 initializes every available position in cylindrical coordinates and associates the experimental value of the magnetization with each position. The position coordinates and the magnetization are then stored in a location file, which will be accessed by a shimming program, Program 3. Program 2 can also be used to add new positions at a later time.

The third program, Program 3, reads the available locations from the location file and reads the occupied positions from the occupied position file. It prompts the user for the number of spheres to place, the minimum sphere diameter to use, the maximum sphere diameter to use, and the sphere diameter step size. This is the sphere action determination procedure shown in FIG. 7. Program 3 calculates the standard deviation and the range of each calculated trial map created by the addition of the base map and the map of the effect of a sphere. The calculations are made for every size sphere in every available position. The output of Program 3 is a sphere size and location that is the sphere size and location that lowered the standard deviation and/or the range of the map the most. Program 3 also stores a list of the placed shimming spheres in a list file. A new, calculated map is also provided as an output. Program 3 also may be used after many shimming spheres have been placed, with an updated map of the magnetic field. Program 3 receives as inputs the field map and the list file, and calculates the standard deviation and the range of each trial map created by the addition of the base map and the map of the effect of the removal of a placed sphere. Each sphere on the list of placed spheres is tested in this way. As a result, it can be determined which sphere shim can be removed to decrease the standard deviation and the range of the field map the most. A new, calculated map is provided as an output. This process is shown in FIG. 7.

According to the present invention, a method and apparatus for modifying the uniformity of a magnetic field formed by a magnet assembly are provided. The foregoing description uses the example of modification of the background magnetic field created by an MRI magnet assembly.

However, the present invention is applicable to control of any modification of a magnetic field created by a magnet or magnet assembly, including applications where the intent is to make the field less uniform, or to control the homogeneity of the field in some other way. Thus, the examples described herein are not intended to limit the scope of the invention to any particular use or result.

For example, the apparatus of the invention may be used in a modified iterative process for achieving a desired level of homogeneity of the field. Such an alternative exemplary process can include obtaining an initial field map, and then calculating the effect on the field of every combination of sphere diameter at every available location for every sphere action, that is, for adding, removing, or changing the size of a sphere at every location available for placement of a shimming sphere. The size/location/action that is determined to have the greatest advantageous effect on the homogeneity of the field can then be implemented, and a new field map is obtained. The action of determining the size/location/action that will have the greatest advantageous effect, with respect to the updated map, is then repeated. The result is then implemented, and the action can be repeated a number of times, until the measured level of homogeneity of the field reaches an acceptable value.

Further, parameters of the shimming spheres other than the size may be variable. For example, spheres made of different magnetic material will affect the field to a different extent. Thus, selecting shimming spheres made of different magnetic materials as well as having different diameters may be performed as part of the shimming process.

The present invention has been described by way of example and in terms of preferred embodiments. However, it is to be understood that the present invention is not strictly limited to the disclosed embodiments. To the contrary, various modifications, as well as similar arrangements, are included within the spirit and scope of the present invention. The scope of the appended claims, therefore, should be accorded the broadest possible interpretation so as to encompass all such modifications and similar arrangements.

What is claimed is:

1. A process for adjusting an homogeneity of a magnetic field produced by a magnet having a pole, comprising:

mapping the magnetic field to provide an original field map;

selecting a sphere action that will adjust the homogeneity of the magnetic field, wherein the selected sphere action is selected from the group consisting of adding, removing, and replacing a spherically-shaped magnetic shim element within the magnetic field so as to become magnetized and have an effect on the magnetic field;

calculating an effect on the magnetic field caused by the selected sphere action;

combining the calculated effect on the magnetic field of the selected sphere action with the original field map, to provide an adjusted field map;

comparing the adjusted field map with the original field map;

determining, based on the comparison, if the adjusted field map indicates a satisfactory adjustment of the homogeneity of the magnetic field; and performing the selected sphere action to adjust the homogeneity of the magnetic field, if it is determined that the adjusted field map indicates a satisfactory adjustment of the homogeneity of the magnetic field.

2. The process of claim 1, further comprising:

determining, based on the adjusted field map, if the magnetic field, including the effect on the magnetic field of the selected sphere action, has an acceptable level of homogeneity; and selecting a second sphere action that will adjust the homogeneity of the magnetic field, if it is determined that the level of homogeneity of the magnetic field, including the effect on the magnetic field of the selected sphere action, is not an acceptable level.

3. The process of claim 1, further comprising:

determining, based on the adjusted field map, if the magnetic field, including the effect on the magnetic field of the selected sphere action, has an acceptable level of homogeneity;

calculating a plurality of sphere actions, in series, that will adjust the homogeneity of the magnetic field, if it is determined that the level of homogeneity of the magnetic field, including the effect on the magnetic field of the selected sphere action, is not an acceptable level, wherein the series is continued until it is determined that the level of homogeneity of the magnetic field, including the effect on the magnetic field of the selected sphere actions, is an acceptable level; and performing the selected plurality of sphere actions to adjust the homogeneity of the magnetic field.

4. The process of claim 3, further comprising:

calculating an effect on the magnetic field caused by each of the selected sphere actions;

combining the calculated effect on the magnetic field of each of the selected sphere actions with the original field map, to provide a respective adjusted field map;

comparing each adjusted field map in the series with the previous field map in the series;

determining, based on the comparison, if each adjusted field map indicates a satisfactory adjustment of the homogeneity of the magnetic field with respect to the previous field map in the series; and performing the selected sphere actions for which it is determined that the respective adjusted field map indicates a satisfactory adjustment of the homogeneity of the magnetic field.

5. The process of claim 4, wherein the satisfactory adjustment of the homogeneity of the magnetic field is an adjustment that increases the homogeneity of the magnetic field.

6. The process of claim 1, wherein the satisfactory adjustment of the homogeneity of the magnetic field is an adjustment that increases the homogeneity of the magnetic field.

7. The process of claim 1, wherein calculating the effect on the magnetic field caused by the selected sphere action includes calculating at least one of the standard deviation and the range of the magnetic field.

8. The process of claim 1, wherein the spherically-shaped magnetic shim element includes a soft-ferromagnetic material.

9. The process of claim 1, further comprising attaching a non-magnetic plate to the magnet pole, wherein the non-magnetic plate is adapted to receive at least one said spherically-shaped magnetic shim element such that the spherically-shaped magnetic shim element is disposed at a fixed position with respect to the non-magnetic plate.

10. The process of claim 9, wherein the non-magnetic plate is a first non-magnetic plate, and further comprising:

attaching a second non-magnetic plate to the magnet pole outside a peripheral area of the first non-magnetic plate, wherein the non-magnetic plate is adapted to receive at least one additional magnetic shim element such that the additional shim element is disposed at a fixed position with respect to the second non-magnetic plate.

11. The process of claim 9, further comprising, when performing the selected sphere action that is one of adding and replacing the spherically-shaped magnetic shim element:

placing the spherically-shaped magnetic shim element in a shim holder, and subsequently placing the shim holder such that the spherically-shaped magnetic shim element is disposed at the fixed position with respect to the non-magnetic plate.

12. The process of claim 11, wherein the shim holder is a non-magnetic sphere having a bore for receiving the spherically-shaped magnetic shim element, and wherein the non-magnetic plate includes a notched hole at the fixed position, such that a diameter of the hole is smaller than a diameter of the non-magnetic sphere, and a diameter of the notch is at least as large as the diameter of the non-magnetic sphere.

13. The process of claim 11, wherein the shim holder is a non-magnetic screw having outer threads, and a bore for receiving the spherically-shaped magnetic shim element;

wherein the non-magnetic plate includes a threaded hole at the fixed position for receiving the non-magnetic screw, such that the threaded hole mates with the outer threads of the non-magnetic screw.

14. The process of claim 11, wherein the non-magnetic plate is adapted to receive the shim holder at a plurality of positions, wherein any of the plurality of positions can be selected to be the fixed position.

15. A process for adjusting an homogeneity of a magnetic field produced by a magnet having a pole, comprising:

placing at least one spherically-shaped magnetic shim element within the magnetic field so as to become magnetized and have an effect on the magnetic field;

mapping the magnetic field to provide an original field map;

selecting a sphere action that will adjust the homogeneity of the magnetic field, wherein the selected sphere action is selected from the group consisting of adding, removing, and replacing at least one of the spherically-shaped magnetic shim elements within the magnetic field so as to become magnetized and have an effect on the magnetic field;

calculating an effect on the magnetic field caused by the selected sphere action;

combining the calculated effect on the magnetic field of the selected sphere action with the original field map, to provide an adjusted field map;

comparing the adjusted field map with the original field map;

determining, based on the comparison, if the adjusted field map indicates a satisfactory adjustment of the homogeneity of the magnetic field; and performing the selected sphere action to adjust the homogeneity of the magnetic field, if it is determined that the adjusted field map indicates a satisfactory adjustment of the homogeneity of the magnetic field.

16. The process of claim 15, further comprising:

determining, based on the adjusted field map, if the magnetic field, including the effect on the magnetic field of the selected sphere action, has an acceptable level of homogeneity; and selecting a second sphere action that will adjust the homogeneity of the magnetic field, if it is determined that the level of homogeneity of the magnetic field, including the effect on the magnetic field of the selected sphere action, is not an acceptable level.

17. The process of claim 15, further comprising:

determining, based on the adjusted field map, if the magnetic field, including the effect on the magnetic field of the selected sphere action, has an acceptable level of homogeneity;

calculating a plurality of sphere actions, in series, that will adjust the homogeneity of the magnetic field, if it is determined that the level of homogeneity of the magnetic field, including the effect on the magnetic field of the selected sphere action, is not an acceptable level, wherein the series is continued until it is determined that the level of homogeneity of the magnetic field, including the effect on the magnetic field of the selected sphere actions, is an acceptable level; and performing the selected plurality of sphere actions to adjust the homogeneity of the magnetic field.

18. The process of claim 17, further comprising:

calculating an effect on the magnetic field caused by each of the selected sphere actions;

combining the calculated effect on the magnetic field of each of the selected sphere actions with the original field map, to provide a respective adjusted field map;

comparing each adjusted field map in the series with the previous field map in the series;

determining, based on the comparison, if the adjusted field map indicates a satisfactory adjustment of the homogeneity of the magnetic field; and performing the selected sphere action to adjust the homogeneity of the magnetic field, if it is determined that the adjusted field map indicates a satisfactory adjustment of the homogeneity of the magnetic field.

19. The process of claim 18, wherein the satisfactory adjustment of the homogeneity of the magnetic field is an adjustment that increases the homogeneity of the magnetic field.

20. The process of claim 15, wherein the satisfactory adjustment of the homogeneity of the magnetic field is an adjustment that increases the homogeneity of the magnetic field.

21. The process of claim 15, wherein calculating the effect on the magnetic field caused by the selected sphere action includes calculating at least one of the standard deviation and the range of the magnetic field.

22. The process of claim 15, further comprising attaching a non-magnetic plate to the magnet pole, wherein the non-magnetic plate is adapted to receive at least one said spherically-shaped magnetic shim element such that the spherically-shaped magnetic shim element is disposed at a fixed position with respect to the non-magnetic plate.

23. The process of claim 22, wherein the non-magnetic plate is a first non-magnetic plate, and further comprising:

attaching a second non-magnetic plate to the magnet pole outside a peripheral area of the first non-magnetic plate, wherein the non-magnetic plate is adapted to receive at least one additional magnetic shim element such that the additional shim element is disposed at a fixed position with respect to the second non-magnetic plate.

24. The process of claim 22, further comprising, when performing the selected sphere action that is one of adding and replacing the spherically-shaped magnetic shim element:

placing the spherically-shaped magnetic shim element in a shim holder; and subsequently placing the shim holder such that the spherically-shaped magnetic shim element is disposed at the fixed position with respect to the non-magnetic plate.

25. The process of claim 24, wherein the shim holder is a non-magnetic sphere having a bore for receiving the spherically-shaped magnetic shim element, and wherein the non-magnetic plate includes a notched hole at the fixed position, such that a diameter of the hole is smaller than a diameter of the non-magnetic sphere, and a diameter of the notch is at least as large as the diameter of the non-magnetic sphere.

26. The process of claim 24, wherein the shim holder is a non-magnetic screw having outer threads, and a bore for receiving the spherically-shaped magnetic shim element;
wherein the non-magnetic plate includes a threaded hole at the fixed position for receiving the non-magnetic screw, such that the threaded hole mates with the outer threads of the non-magnetic screw.

27. The process of claim 24, wherein the non-magnetic plate is adapted to receive the shim holder at a plurality of positions, wherein any of the plurality of positions can be selected to be the fixed position.

28. The process of claim 15, wherein the spherically-shaped magnetic shim element includes a soft-ferromagnetic material.

29. The process of claim 15, wherein said at least one spherically-shaped magnetic shim element is a plurality of spherically-shaped magnetic shim elements.

30. The process of claim 29, wherein each said spherically-shaped magnetic shim element is formed from material that includes a magnetic material, and the magnetic material of one of the plurality of spherically-shaped magnetic shim elements is different than the magnetic material of another of the plurality of spherically-shaped magnetic shim elements.

31. The process of claim 29, wherein the sphere shape of each of the plurality of spherically-shaped magnetic shim elements has a radius, and the radius of the sphere shape of one of the plurality of spherically-shaped magnetic shim elements is different than the radius of the sphere shape of another of the plurality of spherically-shaped magnetic shim elements.

32. The process of claim 15, wherein the selected sphere action is selected from the group further consisting of moving at least one of the spherically-shaped magnetic shim elements from a current location within the magnetic field to a different location within the magnetic field.

33. The process of claim 15, wherein the selected sphere action is selected from the group further consisting of exchanging a plurality of the spherically-shaped magnetic shim elements among the respective current locations of the plurality of spherically-shaped magnetic shim elements within the magnetic field.

34. The process of claim 15, wherein the selected sphere action is selected from the group further consisting of replacing a first spherically-shaped magnetic shim element having a first size and disposed at a first location within the magnetic field with a replacement, spherically-shaped magnetic shim element having a smaller size and adding a second spherically-shaped magnetic shim element at a second location within the magnetic field, wherein the second spherically-shaped magnetic shim element has a size corresponding to a difference between the first size and the smaller size.

35. The process of claim 15, wherein the selected sphere action is selected from the group further consisting of replacing a first spherically-shaped magnetic shim element having a first size and disposed at a first location within the magnetic field with a first replacement spherically-shaped magnetic shim element having a smaller size and replacing a second spherically-shaped magnetic shim element having a second size and disposed at a second location within the magnetic field with a second replacement spherically-shaped magnetic shim element having a correspondingly larger size.

36. The process of claim 15, wherein the selected sphere action is selected from the group further consisting of replacing a first spherically-shaped magnetic shim element having a first size and disposed at a first location within the magnetic field with a replacement spherically-shaped magnetic shim element having a larger size and adding a second spherically-shaped magnetic shim element at a second location within the magnetic field, wherein the second spherically-shaped magnetic shim element has a size corresponding to a difference between the first size and the larger size.

37. The process of claim 15, wherein the selected sphere action is selected from the group further consisting of replacing a first spherically-shaped magnetic shim element having a first size and disposed at a first location within the magnetic field with a first replacement spherically-shaped magnetic shim element having a larger size and replacing a second spherically-shaped magnetic shim element having a second size and disposed at a second location within the magnetic field with a second replacement spherically-shaped magnetic shim element having a correspondingly smaller size.

38. The process of claim 17, further comprising:
performing a calibration procedure to determine an actual effect on the magnetic field caused by placement of the spherically-shaped magnetic shim elements at different radii away from a center axis of the magnetic field;
mapping the magnetic field to provide a shimming field map; and
calculating an effect of placement of spherically-shaped shim elements at different locations within the magnetic field, based on results of the calibration procedure, prior to placing at least one spherically-shaped magnetic shim element within the magnetic field so as to become magnetized and have an effect on the magnetic field.

39. The process of claim 38, wherein the calibration procedure includes
mapping the magnetic field to provide a first calibration field map, and
determining a map of the actual effect on the magnetic field of spherically-shaped shim elements disposed at different radii away from the center axis of the magnetic field.

40. The process of claim 39, wherein determining the map of the actual effect on the magnetic field of spherically-shaped shim elements disposed at different radii away from the center axis of the magnetic field includes
adding a plurality of spherically-shaped shim elements to the magnet within the magnetic field so as to become magnetized and have an effect on the magnetic field, spaced apart on a circle defined by a first radius away from the center axis of the magnetic field,
mapping the magnetic field to provide a second calibration field map, determining a map of an actual effect on the magnetic field of the spherically-shaped shim elements by subtracting the first calibration field map from the second calibration field map, removing the plurality of spherically-shaped shim elements, and repeating the determination based on a plurality of spherically-shaped shim elements disposed on at least one additional circle defined by a different radius away from the center axis of the magnetic field.

41. The process of claim 15, wherein:

the selected sphere action is a plurality of selected sphere actions;

calculating the effect on the magnetic field caused by the selected sphere action results in a calculation of a cumulative effect of all of the plurality of selected sphere actions;

the adjusted filed map is provided by combining the calculated effect on the magnetic field of all of the plurality of selected sphere actions with the original field map; and the homogeneity of the magnetic field is adjusted by performing all of the plurality of selected sphere actions.

* * * * *